United States Patent
Björkman et al.

(10) Patent No.: US 7,443,169 B2
(45) Date of Patent: Oct. 28, 2008

(54) SHIELD ARRANGEMENT FOR A VACUUM CELL

(75) Inventors: Per Björkman, Palsböle (AX); Urs Wälchli, Chur (CH); Hansjakob Hanselmann, Oberschan (CH); Stanislav Duris, Frümsen (CH); Martin Wüest, Malans (CH)

(73) Assignee: Inficon GmbH, Bad Ragaz (CH)

( * ) Notice: Subject to any disclaimer, the term of this patent is extended or adjusted under 35 U.S.C. 154(b) by 0 days.

(21) Appl. No.: 11/602,797

(22) Filed: Nov. 21, 2006

(65) Prior Publication Data

US 2007/0120568 A1 May 31, 2007

(51) Int. Cl.
G01L 21/30 (2006.01)

(52) U.S. Cl. ........................ 324/460; 73/1.58
(58) Field of Classification Search ............... 324/460
See application file for complete search history.

(56) References Cited

U.S. PATENT DOCUMENTS

| | | | | | |
|---|---|---|---|---|---|
| 1,619,444 | A | * | 3/1927 | Taylor | 138/42 |
| 2,061,949 | A | * | 11/1936 | Monroe | 138/42 |
| 2,503,372 | A | * | 4/1950 | Bagley | 73/714 |
| 2,512,134 | A | * | 6/1950 | Baule | 73/37 |
| 3,168,819 | A | * | 2/1965 | Santeler | 62/55.5 |
| 5,181,422 | A | * | 1/1993 | Leonard et al. | 73/715 |
| 5,307,684 | A | * | 5/1994 | Moss et al. | 73/716 |
| 5,495,748 | A | * | 3/1996 | Brede et al. | 73/40 |
| 5,690,795 | A | * | 11/1997 | Rosenstein et al. | 204/192.1 |
| 6,591,687 | B1 | * | 7/2003 | Bjoerkman et al. | 73/724 |
| 6,901,808 | B1 | | 6/2005 | Sharpless et al. | |
| 2004/0226382 | A1 | | 11/2004 | Lischer et al. | |
| 2006/0156824 | A1 | | 7/2006 | Grudzien | |

FOREIGN PATENT DOCUMENTS

EP 0 549 229 6/1993
WO WO 2006/076745 7/2006

* cited by examiner

Primary Examiner—Vincent Q. Nguyen
Assistant Examiner—Thomas F. Valone
(74) Attorney, Agent, or Firm—Notaro & Michalos P.C.

(57) ABSTRACT

A shield arrangement for a vacuum measuring cell has a tubular shield housing encompassing a shield and an exit port for connection to a vacuum measuring cell and a connection opening for the object space to be measured. The shield is between the two openings and is implemented as a screw shield with spiral convolutions, its thread flange in the outer diameter being in contact on the inner wall of the shield housing such that a gas throughflow between the outer diameter of the thread flange and the inner wall is inhibited and is substantially forced into the spiral thread flight, and the exit port is on one side of the tubular section and the connection opening is on the other, opposite side and the screw shield is implemented such that in the axial line of vision the shield arrangement between the two openings is optically tight.

12 Claims, 3 Drawing Sheets

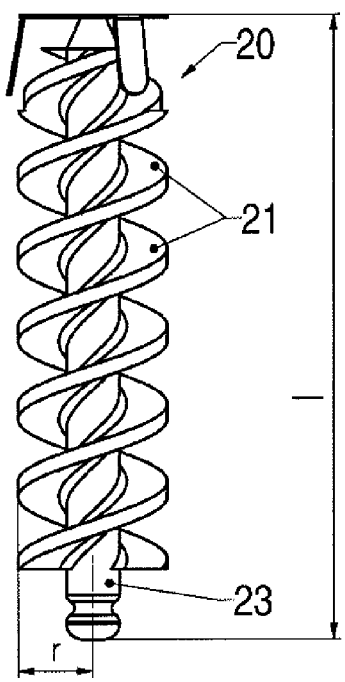
Fig. 3a
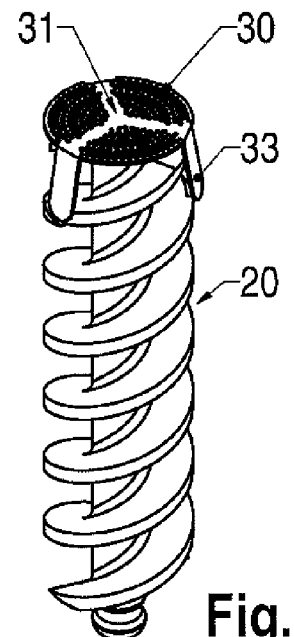
Fig. 3b
   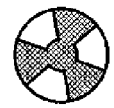
  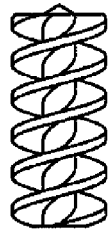 
 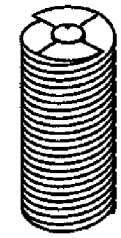 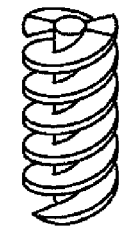 
Fig. 4a  Fig. 4b  Fig. 4c  Fig. 4d

SHIELD ARRANGEMENT FOR A VACUUM CELL

FIELD AND BACKGROUND OF THE INVENTION

The invention relates to a shield arrangement for a vacuum cell.

Total vacuum cells are utilized to measure the total pressure in vacuum chambers. The vacuum measuring cells are employed when monitoring various vacuum processes. Typical vacuum processes are here surface treatment processes, such as for example coating methods and etching methods. Such methods operate for example in the pressure ranges of $10^{-5}$ mbar up to 100 mbar. It is conventional to measure such pressure ranges using so-called Pirani vacuum measuring cells or with so-called diaphragm vacuum measuring cells. One problem encountered herein is that the process gas, but also residual gas components, may contaminate the vacuum sensor during the process. Consequently, imprecise or error measurements or pressure indications, may herein result. The vacuum measuring cells exhibit a drift behavior, corresponding to the time during which they are exposed to the process, which cannot always be eliminated or restored by cleaning the vacuum cell or its surrounding. Diaphragm measuring cells are especially sensitive with respect to possible contaminations. In such diaphragm measuring cells a thin diaphragm is deflected depending on the obtaining pressure which is to be measured. The deflection of this diaphragm is measured and serves as a measure for the vacuum pressure to be measured. In the case of capacitive diaphragm measuring cells the deflection of the diaphragm is measured via the change of capacitance between the diaphragm and the solid body. In the case of optical diaphragm measuring cells this deflection is acquired with optical methods, for example with methods of interferometry. In order to be able to measure such pressure ranges with high sensitivity, the diaphragms must be implemented very thin, for example in the range of 50 to 760 µm. Contaminations of this thin diaphragm, for example with gas and/or with particles, can lead to tensile and/or pressure stress, which additionally affects the deformation of the diaphragm and subsequently leads to error measurements, for example in the absolute values to be measured, or to undesirable drift behavior overtime. In addition, herein the resolution, and consequently the precision, of the measuring cell is decreased and, on the other hand, the reproducibility of the measurement results is not ensured. In order to decrease such contaminations a flat shield, also referred to as baffle by experts in the field, has previously been utilized, as is shown by the example of a capacitive diaphragm vacuum cell in FIG. 1. The vacuum cell 15 is comprised of a first flat and round housing part 1 and a second flat and round housing part 4, between these two housing parts a diaphragm 2 is connected via seals 3, for example a glass solder, forming a sealing such that between the diaphragm and the two housing parts one cavity 9, 10 each is implemented. The one cavity forms a reference vacuum space 10 which communicates across a connection 13 with a getter space 12. In the getter space 12 is disposed a getter 11 for the reliable maintenance of a reference vacuum. Opposite the reference vacuum space 10 on the other side of diaphragm 2 is formed the measuring vacuum space 9, which communicates across an exit port 16 with the shield housing 6, in which a shield 7 is disposed, the shield housing being appropriately connected with the vacuum cell 15 for example via a connection fitting 5. On the shield housing 6 is disposed a connection flange 8 with a connection opening 22, which can be connected with the vacuum process chamber to be measured. The connection opening 22 is so disposed that the shield 7 opposite the exit port 16 of the vacuum cell does not permit a direct through-view: the shield 7 is to deploy its protective effect thereby that the undesirable gases or particles are condensed on the shield surface such that they do not reach into the vacuum cell. In the technical literature this shield is often also referred to as plasma shield. In processes containing reactive gases, these are intended to be preferably condensed on the shield. The sensor drift is hereby intended to be decreased and thereby the service life of the measuring cell to be increased. Although this flat shield improves the service life of the measuring cell, it is not possible to prevent that there is still an appreciable fraction of particles, for example also facilitated through scatter processes, about the shield reach the measuring diaphragm and here falsify the measurement.

SUMMARY OF THE INVENTION

The present invention has as its aim eliminating the disadvantages of prior art. The aim of the present invention is in particular realizing a shield arrangement for vacuum cells, in particular for diaphragm measuring cells, which drastically decreases the contamination of the vacuum cell in order to increase thereby the service life of the measuring cell significantly while ensuring high measuring precision and reproducibility of the vacuum measurement. In addition, the shield arrangement should be economical in production and permit simple cleaning.

The aim is attained in the shield arrangement according to the species for a vacuum cell according to the characteristics of the claims. The dependent patent claim(s) relate to advantageous further embodiments of the invention.

The shield arrangement according to the invention for a vacuum measuring cell comprises a shield arrangement for a vacuum measuring cell with shield housing which encompasses a shield, the shield housing including an exit port for the connection with a vacuum measuring cell and a connection opening for the connection with the object space to be measured and that the shield is disposed between the two openings, the shield housing being a tubular section and the shield implemented as a screw shield with spiral-form convolutions, its thread flank in the outer diameter being in contact on the inner wall of the shield housing, such that a gas throughflow between the outer diameter of the thread flank and the inner wall is inhibited and this throughflow is substantially forced into the spiral-form thread pitch and that the exit port is on the one side of the tubular section and the connection opening on the other side located opposite and the screw shield is implemented such that in the axial line of vision the shield arrangement between the two openings is optically tight.

The screw shield or helix shield is disposed in a tubular section between the sensor and the flange to the vacuum process chamber. This shield can also be utilized in addition to available known shields, as described previously. The screw shield can, moreover, include several paths in order to increase the shielding effect additionally. Due to the screw-form implementation of the shield, the direct through-view from the connection opening to the vacuum measuring cell is reliably avoided, whereby the particles and/or also the particles are forced to interact several times with the surface before they can reach the end of the shield. It is of advantage if the shield is implemented such that it can readily be removed for cleaning or to exchange it. For this purpose with advantage retaining elements, for example resilient elements, are provided on the shield itself and/or also on the tubular housing in order to be able to retain the shield in position. It is favorable to fabricate the shield and/or the housing of a material which is compatible with the process in order to ensure a sufficiently long service life and to avoid additional contaminations through possible decompositions. Reactive processes, in particular reactive plasma processes, often contain aggressive gases and behave correspondingly reactively, also with respect to the employed materials of the utilized structural components. The structural components exposed here, such as shield and/or housing, can for this purpose also be coated with suitable resistant materials.

The various features of novelty which characterize the invention and which are fully embodiment herein and in the Swiss priority application, are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following the invention will be explained schematically and by example in conjunction with Figures. In the drawing depict:

FIG. 3a in side view a shield with retaining elements according to the invention;

FIG. 3b in three-dimensional view a shield according to FIG. 3a;

FIGS. 4a-4d in side view and three-dimensional representation different embodiments of screw shields with different path configurations of the screw surfaces and the thread pitches;

DESCRIPTION OF THE PREFERRED EMBODIMENTS

Figure 1:
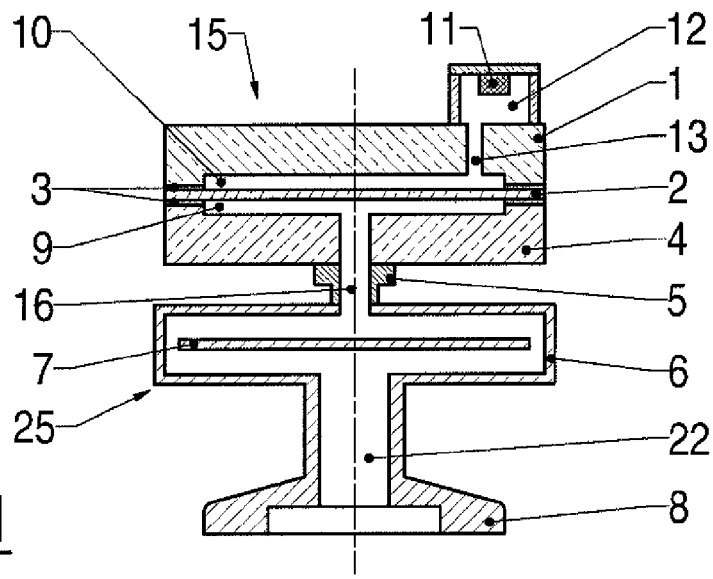
FIG. 1 schematically shows the prior system.
Figure 2:
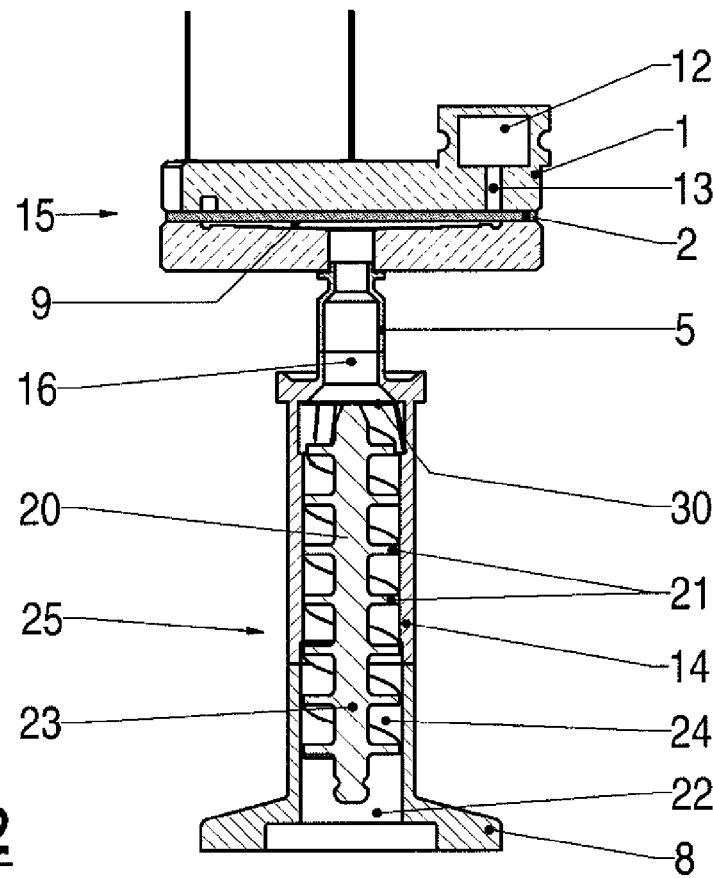
FIG. 2 schematically and in cross section a diaphragm vacuum measuring cell with shield arrangement according to the invention.

FIG. 2 shows in cross section a vacuum measuring cell arrangement according to the invention with a diaphragm vacuum measuring cell 15 and an inventive shield arrangement 25 disposed thereon with a screw shield 20, which is implemented as a spiral-form shield or as helical shield. The vacuum measuring cell 15 is comprised of a first flat round housing part 1 and a second round flat housing part 4, a diaphragm 2 being disposed between them such that it forms a sealing at the periphery. With respect to the first housing part 1 the diaphragm 2 is disposed at such a slight spacing that between them a reference vacuum space is formed, which, via an interconnection 13, is comprised with a getter space 12 for maintaining a reference vacuum. On the opposite diaphragm side between the diaphragm 2 and the second housing part 4 is formed a measuring vacuum space 9, which preferably in the center communicates through the second housing part 4 via an opening and a connection fitting 5 with the shield arrangement 25, which, in turn comprises a connection opening 22 which can be connected communicatingly with the vacuum space to be measured. The screw shield 20 is herein disposed within a tubular section 14, such that the convolutions 21 of the screw shield 20 are in contact on the inner wall of the tubular section 14 such that in this mesh region of the convolutions 21 at least an inhibition for the throughflow of particles is generated, however, preferably as much as possible a sealing in the pressure ranges preferably to be measured. The membrane measuring cell consists preferably of a ceramic material. This includes at least the first housing part or body 1, and the second housing part or body 4 and the membrane 2. These parts are preferably bonded together by the afore mentioned glass braze 3. It is an advantage to use one of the aluminumoxide as ceramic material. The aluminumoxide can also be of the modification of sapphire and be used partially or in combination with the different parts. Such a cell made from aluminumoxide is disclosed in U.S. Pat. No. 6,591,687 and the text of this patent is incorporated here by reference.

The convolutions 21 of the screw shield 20 are implemented such that a spiral-form path 24 results, which, in comparison to the cross section of the screw material, allows to be generated a cross section as large as possible of a free path 24, in order to attain a sufficiently high conductance. The convolutions 21 of the screw shield 20 are therefore preferably implemented as a flat-flight screw 20, which consequently represents a type of sheet-form spiral. In order to obtain the cross section of path 24 as large as possible with respect to the solid body material, the core 23 can be implemented with as small as possible a diameter or it can be omitted entirely. However, it is of advantage if the core has a certain diameter in the range of, for example, 2 to 6 mm in order to lend the spiral-form screw shield 20 appropriate stability and especially also to be able to utilize the ends as securement, on the one hand, for securing the shield within the tube in position, and, on the other hand, to implement on the other side a type of handle which facilitates pulling the shield simply out of the tube if it is to be exchanged for purposes of cleaning.

The one side of the tubular section 14 forms the exit port 16 of the shield arrangement 25 and is communicatingly connected with the measuring vacuum space 9 of the vacuum measuring cell 15. The other side of the tubular section 14 forms the connection opening 22 for the vacuum volume to be measured and may advantageously include directly a connection flange 8 or be implemented as a connection flange 8. The connection flange 8 can here preferably be implemented as a so-called small flange part, such as are conventionally utilized in the dimensions in vacuum technology in order to be able to produce different tube connections in simple manner. In particular here with advantage the flange of type CF, KF and VCR, known in vacuum technology, are utilized.

Viewed in the axial longitudinal direction from the connection opening 22 in the direction toward the exit port 16 of the shield arrangement 25, such arrangement should not permit a through-view, thus should be optically tight. The screw shield 20 should herein have at least 1.5 convolutions 21. However, it is advantageous if the screw shield 20 is implemented as a multi-flight screw and has several convolutions 21, for example 3 to 10 convolutions. It is in many cases sufficient if the tubular section 14 and/or the shield 20 is comprised of an Inox material. Under very difficult to measure conditions, where highly active and aggressive process gases are employed, it is especially of advantage in the shield arrangement 25 according to the invention if the shield 20 and/or the tubular section 14 is fabricated of a material which is capable of withstanding the aggressive process conditions as best as possible and contaminations are not additionally produced through decomposition. To lower costs and to attain special material properties simpler, the exposed surfaces of the tubular section 14 and/or of the shield 20 can also be coated with appropriate protective materials. In certain cases it may also be of advantage if these materials are matched to the type of material of the diaphragm 2 of the vacuum measuring cell 15.

The screw shield 20 according to the invention permits the optimization of the protective properties for the diaphragm 2 of the vacuum measuring cell 15 in multiple and versatile manner. FIG. 4 shows different implementations of a screw shield 20. FIG. 4a shows a single-flight screw shield 20 with a relatively low pitch with a ratio of the passage area to the material cross section of 3.3. FIG. 4b shows an example of a two-flight screw shield 20, in which two threadings are disposed one within the other with a slightly greater pitch and a ratio of the passage area to the material cross section of 6.6. A further two-flight thread configuration is shown in FIG. 4c with twice as large a pitch as according to FIG. 4b with a ratio of passage area to material cross section of 19.8. An example of a three-flight screw shield 20 is shown in FIG. 4d with a medium pitch and a ratio of passage area to material cross section of 9.9. Depending on the process conditions, with the number of threading flights, the number of convolutions, the slopes and the diameter of the screw shield 20 the protective function for the diaphragm 2 of the vacuum measuring cell 15 can be optimized such that, apart from the protective function, also a good measuring performance can be attained.

An enlarged flat-flight screw shield 20 is shown in lateral view in FIG. 3a and in three-dimensional view in FIG. 3b. Apart from the flat-flight screw form depicted here, other forms of the screw cross section are also possible, for example trapezoidal forms, triangular forms or curved forms with tapering convolutions 21. However, the flat-flight screw 20 offers the advantage that the cross section of path 24 can be realized to be as large as possible in order to be able to generate a favorable ratio of the passage area 24 to the remaining material cross section. In addition, this implementation permits a suitable precision in the mesh region of convolutions 21, whereby the screw shield 20 can be produced as an exchangeable part with precision.

It is additionally of advantage if in the proximity of the exit port 16 of the shield arrangement 25, thus when connecting the vacuum measuring cell 15, an additional shield 30 is disposed, which is implemented as a flat shield 30, which preferably has holes 32, which consequently forms a screening shield 30. In FIG. 3 is depicted a preferred embodiment, in which the screening shield 30 is fixed at one end of the rod-form core 23 of the screw shield 20. The shield 30 can additionally be provided at its periphery with retaining links 33, which resiliently assume on the tubular section 14 a retaining and positioning function for the screw shield 20 and preferably engage into a depression, such as for example a groove, in the tubular section 14 for a secure mounting.

To attain good optical tightness and protective effect, the length l of the shield should be greater than its outer diameter 2r. Advantageous dimensions of the screw shield 20 are herein an outer diameter 2r in the range of 10 mm to 40 mm and a length l of 20 mm to 120 mm.

Figure 5:
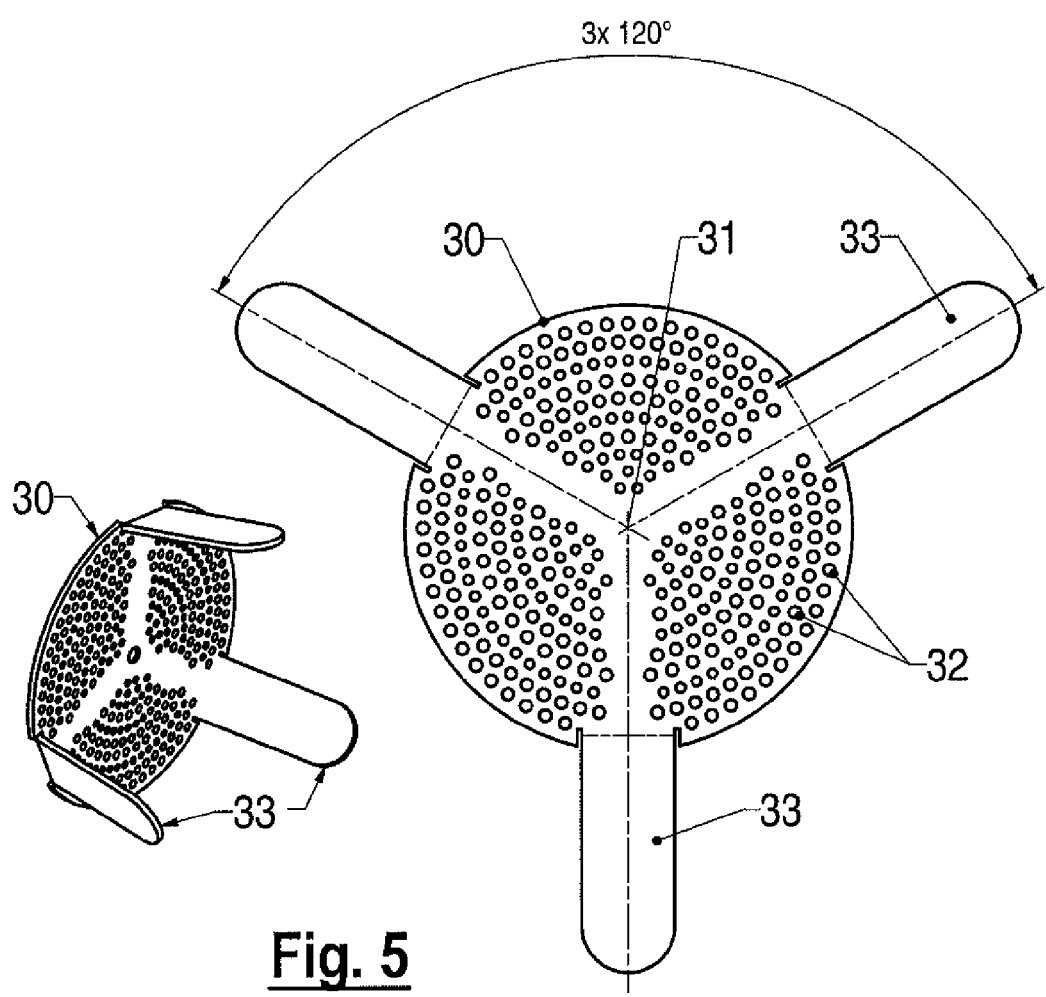
FIG. 5 in enlarged representation an example of a retaining device.

FIG. 5 shows in detail a screening shield 30 in top view. On the periphery of the circular shield 30 provided with holes 32 are provided, for example, three retaining links 33, which are bent by approximately 90 degrees, which subsequently can engage into tubular section 14. The diameter of this screening shield should be such that, like the screw shield 20 in the peripheral region, a penetration of particles is substantially inhibited or prevented.

The invention claimed is:

1. A vacuum measuring cell (15) with a shield arrangement (25) for performing a protective function by decreasing contamination of the vacuum measuring cell in order to increase service life of the measuring cell while ensuring high measuring precision and reproducibility of vacuum measurement, the vacuum measuring cell comprising: a measuring cell housing (1, 4) with a diaphragm (2) for measuring a vacuum, a shield housing encompassing a shield, the shield housing being outside the measuring cell housing and having an exit port (16) with an exit opening connected to the measuring cell housing and a connection opening (22) for connection with an object space to be measured, and the shield being disposed between the openings (16, 22), the shield housing comprising a tubular section (14) and the shield (7, 20) in the tubular section, the shield comprising a screw shield (20) with spiral convolutions (21) defining a spiral path with a cross section, the convolutions having at least one thread flange with an outer diameter in contact with an inner wall of the tubular section (14) so that in an axial line of vision between the openings, the shield is optically tight so as not to permit any through-view between the openings and such that a gas throughflow between the outer diameter of the thread flange and the inner wall is inhibited and such throughflow is forced substantially only into the spiral path, the exit port (16) being on the one side of the tubular section (14) and the connection opening (22) being on the other opposite side of the tubular section, the shield arrangement with its spiral path decreasing contamination of the vacuum measuring cell, and the cross section of the spiral path being larger than a cross section of all solid material of the screw shield so that a favorable ratio of spiral path cross section to solid material cross section is provided for improving the protective function of the shield arrangement and to improve measuring performance of the vacuum measuring cell.

2. A vacuum measuring cell as claimed in claim 1, wherein the screw shield (20) has at least 1.5 convolutions (21).

3. A vacuum measuring cell as claimed in claim 2, wherein the screw shield (20) is a multi-flight screw (20).

4. A vacuum measuring cell as claimed in claim 1, wherein the screw shield (20) is a flat-flight screw (20).

5. A vacuum measuring cell as claimed in claim 1, wherein the screw shield (20) comprises a rod core (23) about which the spiral convolutions are disposed.

6. A vacuum measuring cell as claimed in claim 1, wherein the length (l) of the screw shield (20) is greater than its outer diameter (2r).

7. A vacuum measuring cell as claimed in claim 1, wherein the tubular section (14) includes on the connection opening (22) a connection flange (8) and is formed together with the tubular section (14) of one piece.

8. A vacuum measuring cell as claimed in claim 1, wherein in the proximity of the exit port (16) a circular flat shield (30) is disposed which is as a screening shield (30).

9. A vacuum measuring cell as claimed in claim 8, wherein the flat shield (30) is fixed on the screw shield (20).

10. A vacuum measuring cell as claimed in claim 9, wherein the flat shield has retaining links (33) on its periphery for the fixing on the inner wall of the tubular section (14).

11. A vacuum measuring cell as claimed in claim 1, wherein the screw shield (20) is made so that it can be slid into the tubular section (14) and pulled out of the tubular section.

12. A vacuum measuring cell as claimed in claim 1, wherein the shield arrangement (14, 20, 25) is connected to the measuring cell housing via the exit port (16) and the vacuum measuring cell includes the diaphragm in the measuring cell housing, the vacuum measuring cell comprising one of a capacitive diaphragm measuring cell and an optical diaphragm measuring cell.

* * * * *